(12) United States Patent
Choi (10) Patent No.: US 7,737,744 B2
(45) Date of Patent: Jun. 15, 2010

(54) REGISTER CONTROLLED DELAY LOCKED LOOP CIRCUIT

(75) Inventor: Hoon Choi, Kyoungki-Do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/164,997

(22) Filed: Jun. 30, 2008

(65) Prior Publication Data

US 2009/0256603 A1 Oct. 15, 2009

(30) Foreign Application Priority Data

Apr. 15, 2008 (KR) ............. 10-2008-0034606

(51) Int. Cl.
*H03L 7/06* (2006.01)
(52) U.S. Cl. .................. 327/158; 327/149
(58) Field of Classification Search .......... None
See application file for complete search history.

(56) References Cited

U.S. PATENT DOCUMENTS

| 6,727,738 B2 * | 4/2004 | Tsukikawa ............ 327/160 |
| 7,358,784 B2 * | 4/2008 | Kim et al. ............ 327/158 |
| 2003/0076143 A1 * | 4/2003 | Nishimura et al. ...... 327/158 |
| 2008/0079470 A1 * | 4/2008 | Yun et al. .............. 327/158 |

FOREIGN PATENT DOCUMENTS

| KR | 1020030052651 A | 6/2003 |
| KR | 1020040093819 A | 11/2004 |
| KR | 1020040098899 A | 11/2004 |
| KR | 1020040103035 A | 12/2004 |

OTHER PUBLICATIONS

Notice of Allowance issued from Korean Intellectual Property Office on Aug. 26, 2009 with an English Translation.

* cited by examiner

*Primary Examiner*—Cassandra Cox
(74) *Attorney, Agent, or Firm*—IP & T Law Firm PLC (57) ABSTRACT

A register controlled delay locked loop (DLL) circuit, including: a phase comparator configured to compare phases of a source clock and a feedback clock with each other, and a clock delay circuit configured to delay a phase of an internal clock synchronized with a clock edge of the source clock in response to an output signal of the phase comparator. The clock delay circuit delays the phase of the internal clock using first delay units for a predetermined delay duration, and thereafter delays the phase of the internal clock using second delay units, the second delay unit providing a longer delay than the first delay unit. A delay replica model is configured to reflect actual delay conditions of the source clock in an output clock of the clock delay circuit to output the feedback clock.

17 Claims, 6 Drawing Sheets

REGISTER CONTROLLED DELAY LOCKED LOOP CIRCUIT

CROSS-REFERENCE TO RELATED APPLICATION

The present invention claims priority of Korean patent application number No 10-2008-0034606, filed on Apr. 15, 2008, which is incorporated by reference in its entirety.

BACKGROUND OF THE INVENTION

The present invention relates to semiconductor design, and more particularly, to a delay locked loop (DLL) circuit. Especially, the invention relates to a register controlled DLL that can perform a delay locking operation efficiently regardless of an operation frequency of a semiconductor device with a DLL circuit.

A synchronous semiconductor memory device such as a double data rate synchronous DRAM (DDR SDRAM) performs data transmission with external devices using an internal clock synchronized with an external clock input from an external device such as a memory controller.

This is because the time synchronization between an external clock applied to a memory from a memory controller and data output from the memory is greatly important to stably transmit the data between the memory and the memory controller.

Data from the memory are output in synchronization with an internal clock. The internal clock is applied in synchronization with the external clock when it is applied to the memory initially, however, it is somewhat delayed while passing through each element in the memory. Finally, the internal clock is asynchronous with the external clock when it is output to the outside of the memory.

Therefore, in order to stably transmit the data output from the memory, the internal clock that has been delayed while passing through each element in the memory should be synchronized with the external clock at an edge or a center of the external clock by adjusting a data loading time on a bus to the internal clock for accurately positioning the internal clock.

A clock synchronization circuit of synchronizing the internal clock with the external clock is a phase locked loop (PLL) or a delay locked loop (DLL).

Specifically, when the external clock differs in frequency from the internal clock signal, it is necessary to employ a frequency multiplication function. Thus, the PLL is mainly used in this case. However, when the external clock signal is equal in frequency to the internal clock signal, the DLL is mainly used because the DLL is not greatly affected by a noise and also can be implemented in a relatively small area in comparison with the PLL.

Since a semiconductor memory device uses the same frequency for the external and internal clocks, the DLL is mainly used as a clock synchronization circuit.

Among various kinds of the DLLs, the most recent technology provides a register controlled DLL circuit capable of reducing a time that is taken in locking a first clock. In detail, the register controlled DLL circuit having a register capable of storing a locked delay value, stores the locked delay value in the register when a power is interrupted, and loads the locked delay value stored in the register when the power is turned on again so that the locked delay value is instantly used for locking the clock.

Figure 1:
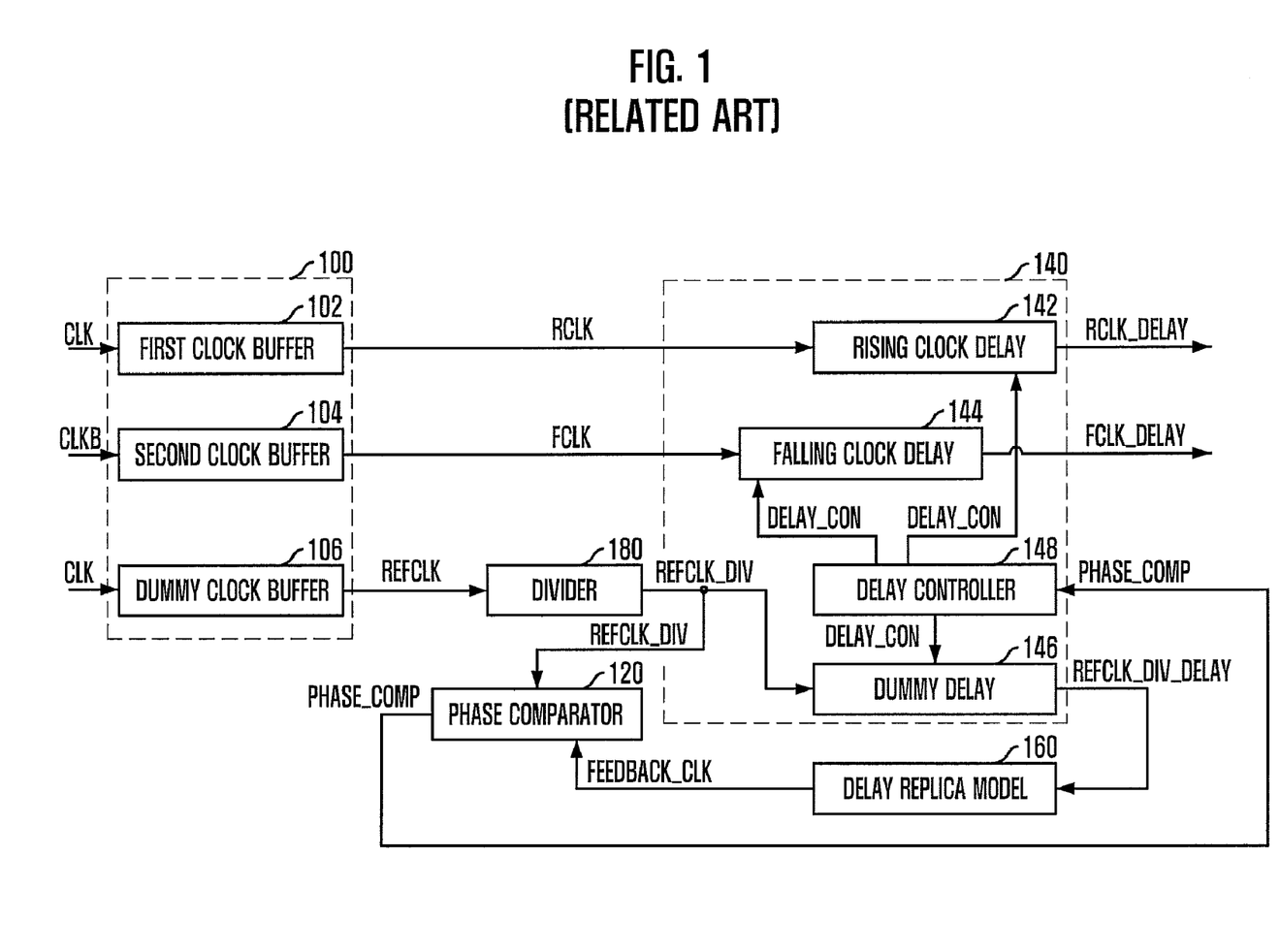
FIG. 1 is a block diagram of a conventional register controlled delay locked loop (DLL) circuit.

FIG. 1 is a block diagram of a conventional register controlled DLL circuit.

Referring to FIG. 1, the conventional register controlled DLL circuit includes a clock buffer 100, a divider 180, a phase comparator 120, a clock delay circuit 140, and a delay replica model 160. The clock buffer 100 buffers a source clock signal CLK and a source clock bar signal CLKB, which are output from the outside. The divider 180 divides a frequency of a reference clock REFCLK synchronized with a clock edge of the source clock signal CLK at a predetermined ratio to output a divided reference clock REFCLK_DIV. The phase comparator 120 compares phases of the divided reference clock REFCLK_DIV and the feedback clock FEEDBACK_CLK with each other. The clock delay circuit 140 delays a phase of a first internal clock RCLK synchronized with a clock edge of the source clock signal CLK, a phase of a second internal clock FCLK synchronized with a clock edge of the source clock bar signal CLKB, and a phase of the divided reference clock REFCLK_DIV by delay durations according to a comparison signal PHASE_COMP of the phase comparator 120. The delay replica model 160 reflects actual delay conditions of the source clock signals CLK and CLKB in a delayed divided reference clock REFCLK_DIV_DELAY of the clock delay circuit 140 corresponding to the input divided reference clock REFCLK_DIV.

The clock buffer 100 includes a first clock buffer 102 configured to buffer the source clock signal CLK to output the first internal clock RCLK, a second clock buffer 104 configured to buffer the source clock bar signal CLKB to output the second internal clock FCLK, and a dummy clock buffer 106 configured to buffer the source clock signal CLK to output the reference clock REFCLK.

The clock delay circuit 140 includes a rising clock delay 142, a falling clock delay 144, a dummy delay 146, and a delay controller 148. The rising clock delay 142 delays the phase of the first internal clock RCLK in response to a delay control signal DELAY_CON, and a falling clock delay 144 delays the phase of the second internal clock FCLK in response to the delay control signal DELAY_CON. The dummy delay 146 delays the phase of the divided reference clock REFCLK_DIV_DELAY in response to the delay control signal DELAY_CON. The delay controller 148 changes a logic level of the delay control signal DELAY_CON in response to the comparison signal PHASE_COMP of the phase comparator 120.

Herebelow are operations of the conventional register controlled DLL circuit having the above configuration.

From the clock buffer 100 configured to buffer the source clock signal CLK and the source clock bar signal CLKB, the first internal clock RCLK and the reference clock REFCLK are output in synchronization with the source clock signal CLK, and the second internal clock FCLK is output in synchronization with the source clock bar signal CLKB. Since the source clock signal CLK is opposite in phase to the source clock bar signal CLKB, the first internal clock RCLK and the reference clock REFCLK are opposite in phase to the second internal clock FCLK.

Therefore, on the basis of the source clock signal CLK, the first internal clock RCLK and the reference clock REFCLK are synchronized with a rising edge of the source clock signal CLK, and the second source clock FCLK is synchronized with a falling edge of the source clock signal CLK.

In the conventional register controlled DLL circuit, the divider 180 configured to divide the frequency of the reference clock REFCLK at a predetermined ratio is employed to reduce power consumption.

That is, the reference clock REFCLK is used to control the operation of the conventional register controlled DLL circuit through phase comparison with the feedback clock FEED- BACK_CLK. If the source clock signal CLK and the source clock bar signal CLKB input from the outside have high frequencies, the reference clock REFCLK and the feedback clock FEEDBACK_CLK also have high frequencies. When comparing phases of the reference clock REFCLK and the feedback clock FEEDBACK_CLK with each other, power consumption becomes larger as the frequencies of the reference clock REFCLK and the feedback clock FEEDBACK_CLK are higher. Accordingly, the conventional register controlled DLL circuit employs a power-saving method of reducing power consumption by performing a phase comparison using the divided reference clock REFCLK_DIV if the external source clock signals CLK and CLKB have high frequencies.

For the aforesaid reason, the conventional register controlled DLL circuit employs the divider 180 between the dummy clock buffer 106 and the phase comparator 120, and thus the phase comparison is performed using the divided reference clock REFCLK_DIV that is obtained by dividing the reference clock REFCLK at a predetermined ratio, instead of directly using the reference clock REFCLK synchronized with the clock edge of the source clock signal CLK. The predetermined ratio is 1/N (N is a natural number greater than 2), generally 4 or 8.

The phase comparator 120, which compares phases of the divided reference clock REFCLK_DIV and the feedback clock FEEDBACK_CLK with each other, changes a value of the comparison signal PHASE_COMP depending on a phase difference between the divided reference clock REFCLK_DIV and the feedback clock FEEDBACK_CLK, thereby controlling the operation of the conventional register controlled DLL circuit.

For example, if the phase difference between the divided reference clock REFCLK_DIV and the feedback clock FEEDBACK_CLK deviates from a predetermined range so that the phase difference becomes relatively great, a first signal value of the comparison signal PHASE_COMP is changed, thus allowing a fast mode operation to be performed.

On the contrary, if the phase difference between the divided reference clock REFCLK_DIV and the feedback clock FEEDBACK_CLK deviates from the predetermined range so that the phase difference becomes relatively small, a second signal value of the comparison signal PHASE_COMP is changed, allowing a normal mode operation to be performed.

If the phase difference between the divided reference clock REFCLK_DIV and the feedback clock FEEDBACK_CLK does not deviate from the predetermined range, a third signal value of the comparison signal PHASE_COMP is changed, allowing a fine mode operation to be performed.

The clock delay circuit 140 performs the following operations in response to the operation of the phase comparator 120. In the fast mode operation, the clock delay circuit 140 delays the phases of the first internal clock RCLK, the second internal clock FCLK and the divided reference clock REFCLK_DIV by a predetermined delay duration of a delay unit group having a plurality of delay units according to the variation of the first signal value of the comparison signal PHASE_COMP.

In the normal mode operation, the clock delay circuit 140 delays the phases of the first internal clock RCLK, the second internal clock FCLK and the divided reference clock REFCLK_DIV using delay units according to the variation of the second signal value of the comparison signal PHASE_COMP.

In the fine mode operation, the clock delay circuit 140 delays the phases of the first internal clock RCLK, the second internal clock FCLK and the divided reference clock REFCLK_DIV by divided delay durations according as the second signal value of the comparison signal PHASE_COMP varies. Herein, the divided delay durations are obtained by dividing a delay duration of a delay unit into the predetermined number.

Figure 2:
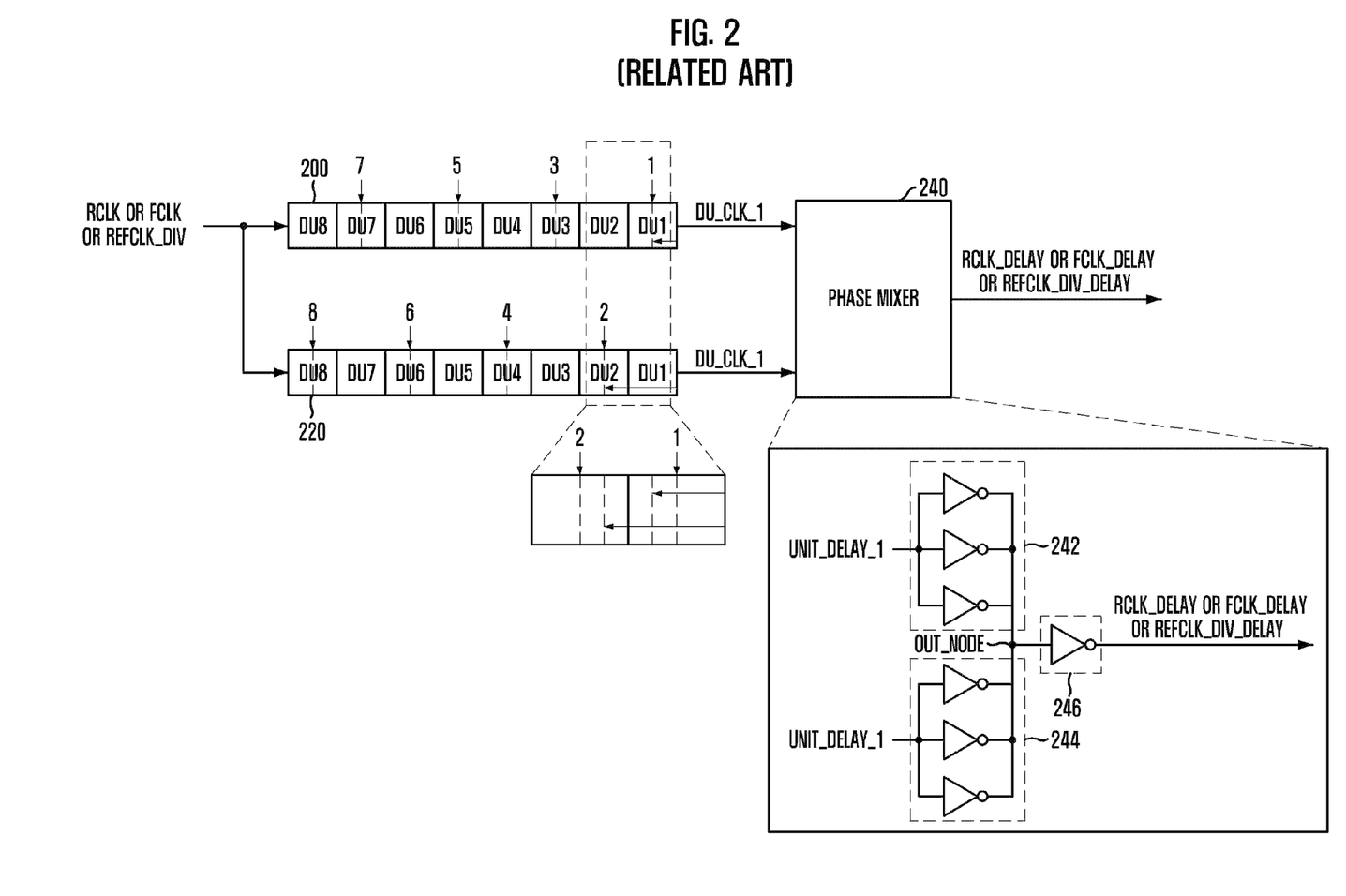
FIG. 2 is a block diagram illustrating a delay unit of a clock delay circuit in the conventional register controlled DLL circuit of FIG. 1.

FIG. 2 is a block diagram illustrating the delay units 142, 144 and 146 of the clock delay circuit 140 in the conventional register controlled DLL circuit of FIG. 1.

Referring to FIG. 2, each of the delay units 142, 144 and 146 of the clock delay circuit 140 in the conventional register controlled DLL circuit includes a first delay line 200, a second delay line 220, and a phase mixer 240. The first delay line 200 includes a plurality of delay units DU1, DU2, DU3, DU4, DU5, DU6, DU7 and DU8 connected in series, and delays the first internal clock RCLK, the second internal clock FCLK or the divided reference clock REFCLK_DIV through the odd-numbered delay units that are selected in predetermined sequence in response to the delay control signal DELAY_CON. The second delay line 220 includes a plurality of delay units DU1, DU2, DU3, DU4, DU5, DU6, DU7 and DU8 connected in series, and delays the first internal clock RCLK, the second internal clock FCLK or the divided reference clock REFCLK_DIV through the even-numbered delay units that are selected in predetermined sequence in response to the delay control signal DELAY_CON. The phase mixer 240 mixes a phase of a clock DU_CLK_1 output from the first delay 200 and a phase of the clock DU_CLK_2 output from the second delay line 220 at a mixing ratio varying according to the delay control signal DELAY_CON.

The phase mixer 240 includes a first inversion-driving unit 242, a second inversion-driving unit 244, and a third inversion-driving unit 246. The first inversion-driving unit 242 inverts and drives the output clock DU_CLK_1 of the first delay line 200 to apply the inverted clock to an output node OUT_NODE with an ability to drive that varies according to the delay control signal DELAY_CON. The second inversion-driving unit 244 inverts and drives the output clock DU_CLK_2 of the second delay line 220 to apply the inverted clock to the output node OUT_NODE with an ability to drive that varies according to the delay control signal DELAY_CON. The third inversion-driving unit 246 inverts and drives a clock of the output node OUT_NODE with a predetermined ability to drive.

Herebelow are operations of the delay units 142, 144 and 146 of the clock delay unit 140 in the conventional register controlled DLL circuit.

First, the first delay line 200 selects the odd-numbered delay units DU1, DU3, DU5 and DU7 among the plurality of delay units DU1, DU2, DU3, DU4, DU5, DU6, DU7 and DU8 in response to the delay control signal DELAY_CON in predetermined sequence. That is, the first delay line 200 delays the first internal clock RCLK, the second internal clock FCLK or the divided reference clock REFCLK_DIV by the point "1", "3", "5" or "7".

The predetermined sequence may differ according to an operation mode of the clock delay circuit 140. In the fast mode, the first delay unit DU1 corresponding to the point "1" among the odd-numbered delay units DU1, DU3, DU5 and DU7 of the first delay line 200 is selected first, and then the fifth delay unit DU5 corresponding to the point "5" is selected. That is, the first delay line 200 delays the first internal clock RCLK, the second internal clock FCLK or the divided reference clock REFCLK_DIV by a delay duration of <½×delay unit> corresponding to the point "1" or by a delay duration of <(4+½)×delay unit> corresponding to the point "5".

In the normal mode, the first delay unit DU1 corresponding to the point "1" among the odd-numbered delay units DU1, DU3, DU5 and DU7 of the first delay line 200 is selected first; then the third delay unit DU3 corresponding to the point "3" is selected; thereafter the fifth delay unit DU5 corresponding to the point "5" is selected; and finally the seventh delay unit DU7 corresponding to the point "7" is selected. That is, the first delay line 200 delays the first internal clock RCLK, the second internal clock FCLK or the divided reference clock REFCLK_DIV by a delay duration of <½×delay unit> corresponding to the point "1", by a delay duration of <(2+½)× delay unit> corresponding to the point "3", by a delay duration of <(4+½)×delay unit> corresponding to the point "5", or by a delay duration of <(6+½)×delay unit> corresponding to the point "7".

In the fine mode, the delay units selected during the normal mode among the odd-numbered delay units DU1, DU3, DU5 and DU7 of the first delay line 200 are maintained as they are. In this mode, the first delay line 200 delays the first internal clock RCLK, the second internal clock FCLK or the divided reference clock REFCLK_DIV to by a delay duration smaller than the delay duration of the delay unit, which will be more fully described together with description for operation of the phase mixer 240 later.

The second delay line 220 selects the even-numbered delay units DU2, DU4, DU6 and DU8 among the plurality of delay units DU1, DU2, DU3, DU4, DU5, DU6, DU7 and DU8 in response to the delay control signal DELAY_CON in predetermined sequence. That is, the second delay line 220 delays the first internal clock RCLK, the second internal clock FCLK or the divided reference REFCLK_DIV by the point "2", "4", "6" or "8".

The predetermined sequence may differ according to an operation mode of the clock delay circuit 140. In the fast mode, the second delay unit DU2 corresponding to the point "2" among the even-numbered delay units DU2, DU4, DU6 and DU8 of the second delay line 220 is selected first, and then the sixth delay unit DU6 corresponding to the point "6" is selected. That is, the second delay line 220 delays the first internal clock RCLK, the second internal clock FCLK or the divided reference clock REFCLK_DIV by a delay duration of <(1+½)×delay unit> corresponding to the point "2" or by a delay duration of <(5+½)×delay unit> corresponding to the point "6".

In the normal mode, the second delay unit DU2 corresponding to the point "2" among the even-numbered delay units DU2, DU4, DU6 and DU8 of the second delay line 220 is selected first; then the fourth delay unit DU4 corresponding to the point "4" is selected; thereafter the sixth delay unit DU6 corresponding to the point "6" is selected; and finally the eighth delay unit DU8 corresponding to the point "8" is selected. That is, the second delay line 220 delays the first internal clock RCLK, the second internal clock FCLK or the divided reference clock REFCLK_DIV by a delay duration of <(1+½)×delay unit> corresponding to the point "2", by a delay duration of <(3+½)×delay unit> corresponding to the point "4", by a delay duration of <(5+½)×delay unit> corresponding to the point "6", or by a delay duration of <(7+½)× delay unit> corresponding to the point "8".

In the fine mode, the delay units selected during the normal mode among the even-numbered delay units DU2, DU4, DU6 and DU8 of the second delay line 220 are maintained as they are. The second delay line 220 delays the first internal clock RCLK, the second internal clock FCLK or the divided reference clock REFCLK_DIV a delay duration smaller than the delay duration of the delay unit, which will also be more fully described together with description for operation of the phase mixer 240 later.

The phase mixer 240 mixes the output clock DU_CLK_1 of the first delay line 200 and the output clock DU_CLK_2 of the second delay line 220 at a mixing ratio corresponding to the delay control signal DELAY_CON.

The mixing ratio corresponding to the delay control signal DELAY_COM varies according to operation of the clock delay unit 140. In the fast mode and the normal mode, the phase mixer 240 mixes the phase of the output clock DU_CLK_1 of the first delay line 200 and the phase of the output clock DU_CLK_2 of the second delay line 220 at a mixing ratio of 1:1.

For example, when the phase of the output clock DU_CLK_1 of the first delay line 200 is delayed by a delay duration of <½×delay unit> corresponding to the point "1", and the phase of the output clock DU_CLK_2 of the second delay line 220 is delayed by a delay duration of <(1+½)× delay unit> corresponding to the point "2", the first internal clock RCLK, the second internal clock FCLK or the divided reference clock REFCLK_DIV is delayed by a delay duration of <1×delay unit> corresponding to the center between the points "1" and "2" so that a delayed first internal clock RCLK_DELAY, a delayed second internal clock FCLK_DELAY or a delayed divided reference clock REFCLK_DIV_DELAY, which has the delay duration of <1×delay unit>, is output from the phase mixer 240.

Likewise, when the phase of the output clock DU_CLK_1 of the first delay line 200 is delayed by a delay duration of <(4+½)×delay unit> corresponding to the point "5", and the phase of the output clock DU_CLK_2 of the second delay line 220 is delayed by a delay duration of <(5+½)×delay unit> corresponding to the point "6", the first internal clock RCLK, the second internal clock FCLK or the divided reference clock REFCLK_DIV is delayed by a delay duration of <5×delay unit> corresponding to the center between the points "5" and "6" so that a delayed first internal clock RCLK_DELAY, a delayed second internal clock FCLK_DELAY or a delayed divided reference clock REFCLK_DIV_DELAY, which has the delay duration of <5×delay unit>, is output from the phase mixer 240.

In the fine mode, the phase of the output clock DU_CLK_1 of the first delay line 200 and the phase of the output clock DU_CLK_2 of the second delay line 220 are mixed at a mixing ratio varying according to the delay control signal.

For example, even in the case where the phase of the output clock DU_CLK_1 of the first delay line 200 is delayed by a delay duration of <½×delay unit> corresponding to the point "1", and the phase of the output clock DU_CLK_2 of the second delay line 220 is delayed by a delay duration of <(1+½)×delay unit> corresponding to the point "2", the first internal clock RCLK, the second internal clock FCLK or the divided reference clock REFCLK_DIV can be delayed by a delay duration of <¾×delay unit> corresponding to ¼ point between the points "1" and "2" so that a delayed first internal clock RCLK_DELAY, a delayed second internal clock FCLK_DELAY or a delayed divided reference clock REFCLK_DIV_DELAY, which has the delay duration of <¾× delay unit>, is output from the phase mixer 240, if the mixing ratio is set such that the output clock DU_CLK_1 of the first delay line 200 is 75% and the output clock DU_CLK_2 of the second delay line 220 is 25%.

In this case, if the mixing ratio is set such that the output clock DU_CLK_1 of the first delay line 200 is 25% and the output clock DU_CLK_2 of the second delay line 220 is 75%, the first internal clock RCLK, the second internal clock FCLK or the divided reference clock REFCLK_DIV can be delayed by a delay duration of <(1+¼)×delay unit> corresponding to ¾ point between the points "1" and "2" so that a delayed first internal clock RCLK_DELAY, a delayed second internal clock FCLK_DELAY or a delayed divided reference clock REFCLK_DIV_DELAY, which has the delay duration of <(1+¼)×delay unit>, is output from the phase mixer 240.

As described above, the conventional register controlled DLL circuit appropriately controls the delay control signal DELAY_CON according to an operation mode, making it possible to select a delay duration smaller than the delay duration of the delay unit.

Figure 3:
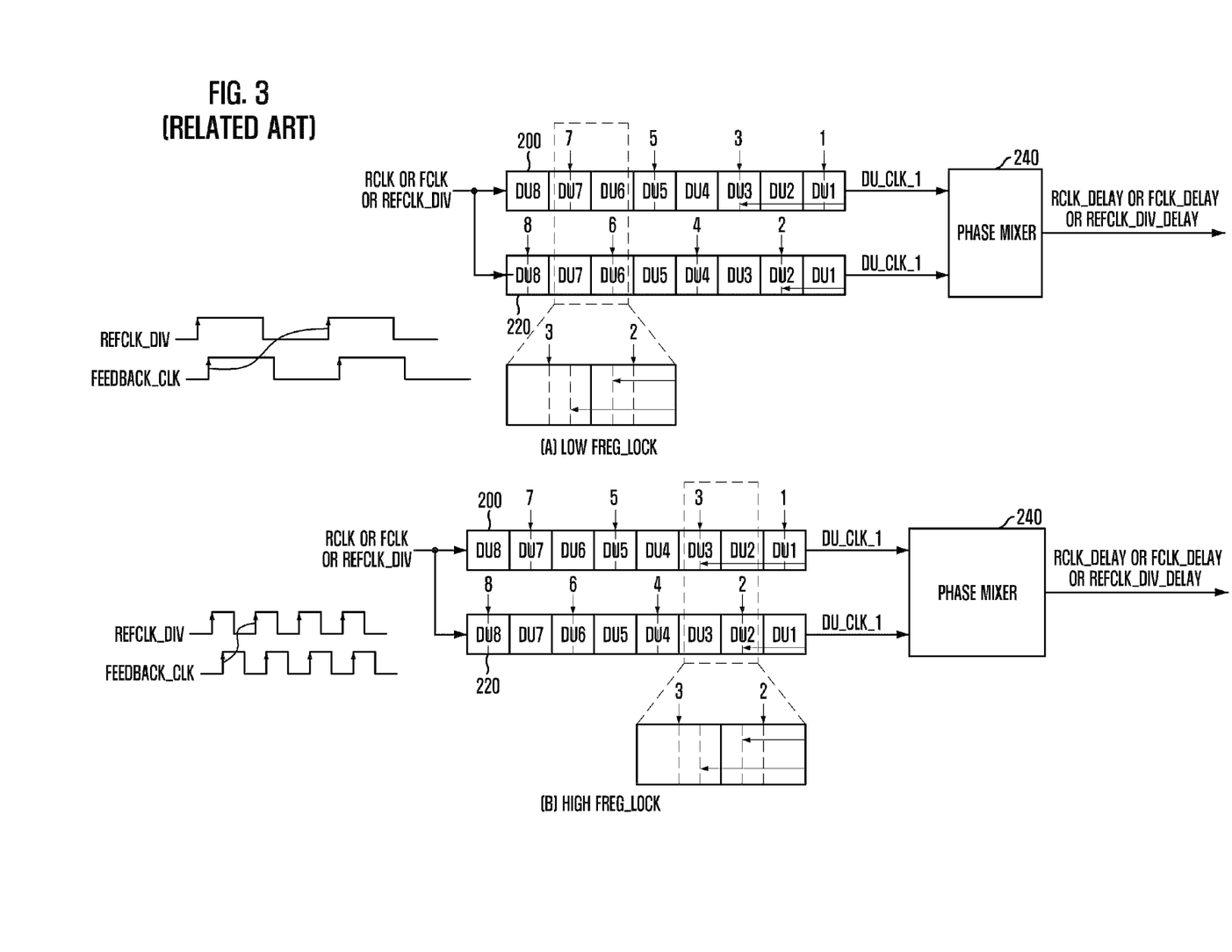
FIG. 3 illustrates a problem arising in operation of the delay unit of the clock delay circuit in the conventional register controlled DLL circuit of FIG. 1.

FIG. 3 illustrates a problem arising in operation of the delay unit of the clock delay circuit 140 in the conventional register controlled DLL circuit of FIG. 1.

Referring to FIG. 3, the divided reference clock REFCLK_DIV and the feedback clock FEEDBACK_CLK, which have different frequencies from each other, are input to the delay units 142, 144 and 146 of the clock delay circuit 140 in the conventional register controlled DLL circuit of FIG. 1.

When the divided reference clock REFCLK_DIV and the feedback clock FEEDBACK_CLK have low frequencies (see LOW FREG_LOCK in FIG. 3A), it can be appreciated that the divided reference clock REFCLK_DIV and the feedback clock FEEDBACK_CLK have relatively long periods. Hence, a delay duration between the feedback clock FEEDBACK_CLK and the divided reference clock REFCLK_DIV for performing a delay locking operation is relatively large.

Therefore, the delay units 142, 144 and 146 of the clock delay circuit 140 delay the first internal clock RCLK, the second internal clock FCLK or the divided reference clock REFCLK_DIV by a relatively large delay duration, and then output the delayed first internal clock RCLK_DELAY, the delayed second internal clock FCLK_DELAY or the delayed divided reference clock REFCLK_DIV_DELAY.

Specifically, in the first delay line 200 of each of the delay units 142, 144 and 146 in the clock delay circuit 140, the delay duration between the divided reference clock REFCLK_DIV and the feedback clock FEEDBACK_CLK is smaller than the delay duration corresponding to the point "7" and greater than the delay duration corresponding to the point "5", but closer to the delay duration corresponding to the point "7". Consequently, the point "5" is selected in the fast mode, and the point "7" is selected in the normal mode.

In the second delay line 220 of each of the delay units 142, 144 and 146 in the clock delay circuit 140, the delay duration between the divided reference clock REFCLK_DIV and the feedback clock FEEDBACK_CLK is smaller than the delay duration corresponding to the point "8" and greater than the delay duration corresponding to the point "6", but closer to the delay duration corresponding to the point "6". Consequently, the point "6" is selected in the fast mode, and the point "6" is also selected in the normal mode.

In the fine mode, the phase mixer 240 of each of the delay units 142, 144 and 146 delays the first internal clock RCLK, the second internal clock FCLK or the divided reference clock REFCLK_DIV in units of a divided delay duration, e.g., a delay duration of <¼×delay unit> in FIG. 3, according to the delay control signal DELAY_CON. Herein, the divided delay duration is obtained by dividing a difference between the delay duration corresponding to the point "7" selected by the first delay line 200 in the normal mode and the delay duration corresponding to the point "6" selected by the second delay line 220 in the normal mode into a predetermined number, e.g., 4.

A delay duration between the feedback clock FEEDBACK_CLK and the divided reference clock REFCLK_DIV, allowing the delay locking operation to be performed in the fine mode operation of the phase mixer 240, may vary in units of a delay duration of <¼×delay unit> between the delay duration of <(6+½)×delay unit> corresponding to the point "7" and the delay duration of <(5+½)×delay unit> corresponding to the point "6". That is, compared to the maximum delay duration and the minimum delay duration between the divided reference clock REFCLK_DIV and the feedback clock FEEDBACK_CLK, the variable delay duration due to the fine mode operation of the phase mixer 240 is relatively small.

Therefore, when the divided reference clock REFCLK_DIV and the feedback clock FEEDBACK_CLK have relatively low frequencies, it is possible to finely adjust the delay duration between the divided reference clock REFCLK_DIV and the feedback clock FEEDBACK_CLK to perform the delay locking operation through the fine mode operation of the phase mixer 240.

In contrast, when the divided reference clock REFCLK_DIV and the feedback clock FEEDBACK_CLK have high frequencies (see HIGH FREG_LOCK in FIG. 3B), it can be appreciated that the divided reference clock REFCLK_DIV and the feedback clock FEEDBACK_CLK have relatively short periods. Hence, a delay duration between the feedback clock FEEDBACK_CLK and the divided reference clock REFCLK_DIV for performing a delay locking operation is relatively small.

Therefore, the delay units 142, 144 and 146 of the clock delay circuit 140 delay the first internal clock RCLK, the second internal clock FCLK or the divided reference clock REFCLK_DIV by a relatively small delay duration, and then output the delayed first internal clock RCLK_DELAY, the delayed second internal clock FCLK_DELAY or the delayed divided reference clock REFCLK_DIV_DELAY.

Specifically, in the first delay line 200 of each of the delay units 142, 144 and 146 in the clock delay circuit 140, the delay duration between the divided reference clock REFCLK_DIV and the feedback clock FEEDBACK_CLK is smaller than the delay duration corresponding to the point "3" and greater than the delay duration corresponding to the point "1", but closer to the delay duration corresponding to the point "3". Consequently, the point "1" is selected in the fast mode, and the point "3" is selected in the normal mode.

In the second delay line 220 of each of the delay units 142, 144 and 146 in the clock delay circuit 140, the delay duration between the divided reference clock REFCLK_DIV and the feedback clock FEEDBACK_CLK is smaller than the delay duration corresponding to the point "4" and greater than the delay duration corresponding to the point "2", but closer to the delay duration corresponding to the point "2". Consequently, the point "2" is selected in the fast mode, and the point "2" is also selected in the normal mode.

In the fine mode, the phase mixer 240 of each of the delay units 142, 144 and 146 delays the first internal clock RCLK, the second internal clock FCLK or the divided reference clock REFCLK_DIV in units of a divided delay duration, e.g., a delay duration of <¼×delay unit> in FIG. 3, according to the delay control signal DELAY_CON. Herein, the divided delay duration is obtained by dividing a difference between the delay duration corresponding to the point "3" selected by the first delay line 200 in the normal mode and the delay duration corresponding to the point "2" selected by the second delay line 220 in the normal mode into a predetermined number, e.g., 4.

A delay duration between the feedback clock FEEDBACK_CLK and the divided reference clock REFCLK_DIV, allowing the delay locking operation to be performed in the fine mode operation of the phase mixer 240, may vary in units of a delay duration of <¼×delay unit> between the delay duration of <(2+½)×delay unit> corresponding to the point "3" and the delay duration of <(1+½)×delay unit> corresponding to the point "2". That is, compared to the maximum delay duration and the minimum delay duration between the divided reference clock REFCLK_DIV and the feedback clock FEEDBACK_CLK, the variable delay duration due to the fine mode operation of the phase mixer 240 is relatively large.

Therefore, when the divided reference clock REF-CLK_DIV and the feedback clock FEEDBACK_CLK have relatively high frequencies, it is difficult to finely adjust the delay duration between the divided reference clock REF-CLK_DIV and the feedback clock FEEDBACK_CLK to perform the delay locking operation through the fine mode operation of the phase mixer 240.

Consequently, in an environment where high-frequency source clock signals CLK and CLKB are used, a jitter with a relatively high value is generated between the delayed first internal clock RCLK_DELAY and the second internal clock FCLK_DELAY although the conventional register controlled DLL circuit has performed a delay locking operation.

SUMMARY OF THE INVENTION

Embodiments of the present invention are directed to providing a register controlled delay locked loop (DLL) circuit allowing a variation width of an adjustable delay duration according to an operation frequency of a semiconductor device with a DLL to be changed.

In accordance with an aspect of the invention, there is provided a register controlled delay locked loop (DLL) circuit, including: a phase comparator configured to compare phases of a source clock and a feedback clock with each other; a clock delay circuit configured to delay a phase of an internal clock synchronized with a clock edge of the source clock in response to an output signal of the phase comparator, wherein the clock delay circuit delays the phase of the internal clock using first delay units until a delay duration reaches a predetermined delay duration, and delays the phase of the internal clock using second delay units after a delay duration reaches the predetermined delay duration, the second delay unit having a larger delay duration than the first delay unit; and a delay replica model configured to reflect actual delay conditions of the source clock in an output clock of the clock delay circuit to output the feedback clock.

In accordance with another aspect of the invention, there is provided a register controlled DLL circuit, including: a phase comparator configured to compare phases of a source clock and a feedback clock with each other; a first clock delay configured to delay a phase of an internal clock synchronized with a clock edge of the source clock using first delay units in response to an output signal of the phase comparator during a predetermined first operation; a second clock delay configured to delay the phase of the internal clock synchronized with a clock edge of the source clock using second delay units in response to the output signal of the phase comparator during a predetermined second operation subsequent to the predetermined first operation, the second delay unit having a larger delay duration than the first delay; and a delay replica model configured to reflect actual delay conditions of the source clock in an output clock of the first clock delay or an output clock of the second clock delay to output the feedback clock.

In accordance with another aspect of the invention, there is provided a register controlled DLL circuit, including: a phase comparator configured to compare phases of a source clock and a feedback clock with each other; a clock delay circuit configured to delay a phase of an internal clock synchronized with a clock edge of the source clock in response to an output signal of the phase comparator, wherein the clock delay circuit delays the phase of the internal clock using delay units having different delay durations during a plurality of operations performed in predetermined sequence; and a delay replica model configured to reflect actual delay conditions of the source clock in an output clock of the clock delay circuit to output the feedback clock.

DESCRIPTION OF SPECIFIC EMBODIMENTS

Hereinafter, a register controlled DLL circuit in accordance with the present invention will be described in detail with reference to the accompanying drawings.

Figure 4:
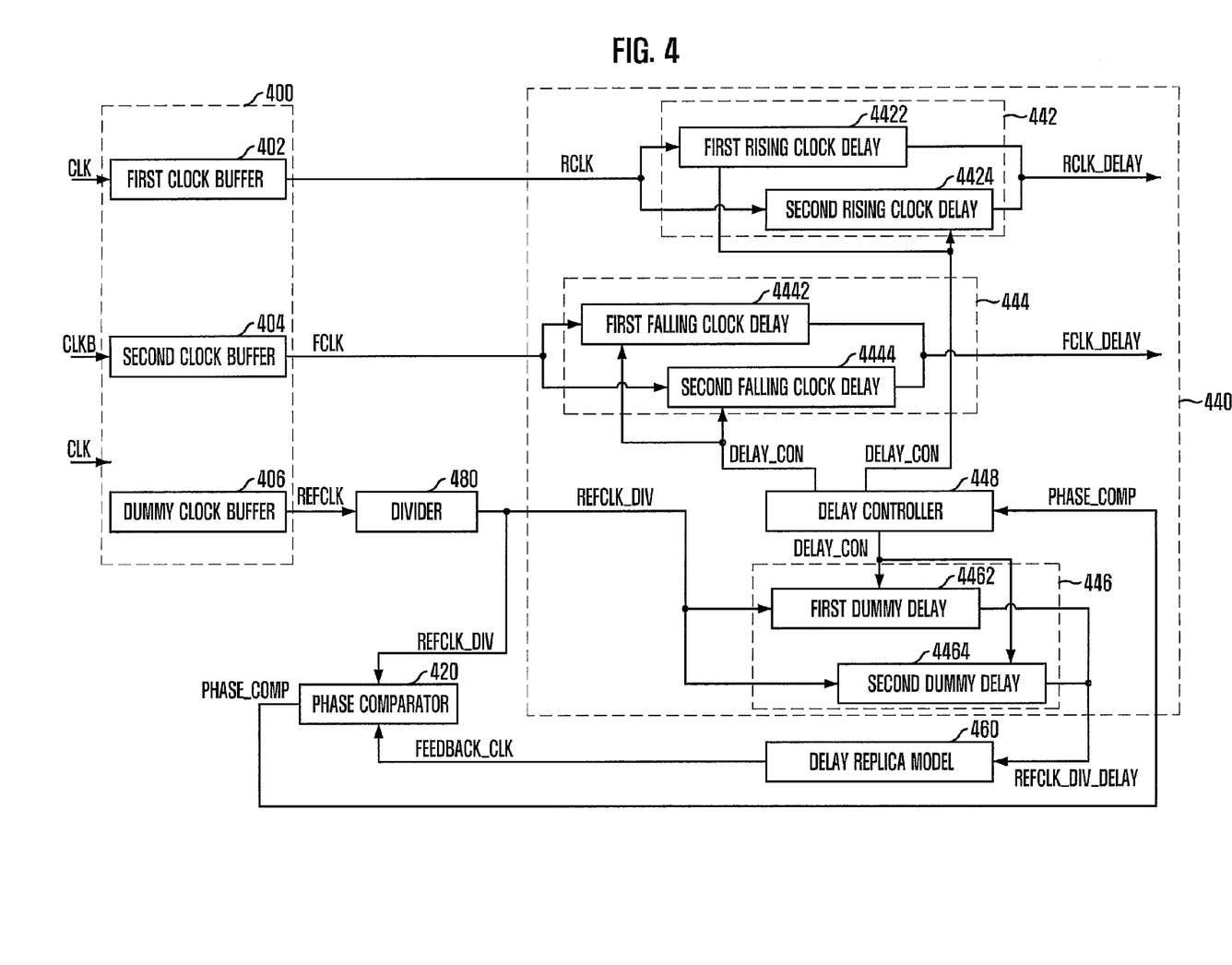
FIG. 4 is a block diagram of a register controlled DLL circuit in accordance with an embodiment of the present invention.

FIG. 4 is a block diagram of a register controlled DLL circuit in accordance with an embodiment of the invention.

Referring to FIG. 4, the register controlled DLL circuit in accordance with the embodiment of the invention includes a clock buffer 400, a divider 480, a phase comparator 420, a clock delay circuit 440, and a delay replica model 460. The clock buffer 400 buffers a source clock signal CLK and a source clock bar signal CLKB, which are output from the outside. The divider 480 divides a frequency of a reference clock REFCLK synchronized with a clock edge of the source clock signal CLK at a predetermined ratio to output a divided reference clock REFCLK_DIV. The phase comparator 420 compares phases of the divided reference clock REF-CLK_DIV and the feedback clock FEEDBACK_CLK with each other. The clock delay circuit 440 delays a phase of a first internal clock RCLK synchronized with a clock edge of the source clock signal CLK, a phase of a second internal clock FCLK synchronized with a clock edge of the source clock bar signal CLKB, and a phase of the divided reference clock REFCLK_DIV by a delay duration according to a comparison signal PHASE_COMP of the phase comparator 420. Specifically, the clock delay circuit 440 delays the first internal clock RCLK, the second internal clock FCLK and the divided reference clock REFCLK_DIV using first delay units until a delay duration reaches a predetermined delay duration, and delays them using second delay units after a delay duration reaches the predetermined delay duration. Herein, the second delay unit has a larger delay duration than the first delay unit. The delay replica model 460 reflects actual delay conditions of the source clock signals CLK and CLKB in a delayed divided reference clock REFCLK_DIV_DELAY of the clock delay circuit 440 corresponding to the input divided reference clock REFCLK_DIV.

The clock buffer 400 includes a first clock buffer 402 configured to buffer the source clock signal CLK to output the first internal clock RCLK, a second clock buffer 404 configured to buffer the source clock bar signal CLKB to output the second internal clock FCLK, and a dummy clock buffer 406 configured to buffer the source clock signal CLK to output the reference clock REFCLK.

The clock delay circuit 440 includes a rising clock delay 442, a falling clock delay 444, a dummy delay 446, and a delay controller 448. The rising clock delay 442 is responsive to a delay control signal DELAY_CON to delay the phase of the first internal clock RCLK using first delay units until a delay duration reaches a predetermined delay duration, and to delay the phase of the first internal clock RCLK using second delay units after a delay duration reaches the predetermined delay duration. The falling clock delay 444 is responsive to the delay control signal DELAY_CON to delay the phase of the second internal clock FCLK using the first delay units until a delay duration reaches a predetermined delay duration, and to delay the phase of the second internal clock FCLK using the second delay units after a delay duration reaches the predetermined delay duration. The dummy delay 446 is responsive to the delay control signal DELAY_CON to delay the phase of the divided reference clock REFCLK_DIV_DELAY using the first delay units until a delay duration reaches a predetermined delay duration, and to delay the phase of the divided reference clock REFCLK_DIV_DELAY using the second delay units after a delay duration reaches the predetermined delay duration. The delay controller 448 changes a logic level of the delay control signal DELAY_CON in response to the comparison signal PHASE_COMP of the phase comparator 420.

The rising clock delay 442 of the clock delay circuit 440 includes a first rising clock delay 4422 configured to delay the phase of the first internal clock RCLK using the first delay units in response to the delay control signal DELAY_CON during a predetermined first operation, and a second rising clock delay 4424 configured to delay the phase of the first internal clock RCLK using the second delay units in response to the delay control signal DELAY_CON during a predetermined second operation. Herein, the second delay unit has a larger delay duration than the first delay unit.

The falling clock delay 444 of the clock delay circuit 440 includes a first falling clock delay 4442 configured to delay the phase of the second internal clock FCLK using the first delay units in response to the delay control signal DELAY_CON during the predetermined first operation, and a second rising clock delay 4444 configured to delay the phase of the second internal clock FCLK using the second delay units in response to the delay control signal DELAY_CON during the predetermined second operation.

The dummy delay 446 of the clock delay circuit 440 includes a first dummy delay 4462 configured to delay the phase of the divided reference clock REFCLK_DIV using the first delay units in response to the delay control signal DELAY_CON during the predetermined first operation, and a second dummy delay 4464 configured to delay the phase of the divided reference clock REFCLK_DIV using the second delay units in response to the delay control signal DELAY_CON during the predetermined second operation.

Herebelow is operation of the register controlled DLL circuit having the above configuration in accordance with the embodiment of the invention.

From the clock buffer 400 configured to buffer the source clock signal CLK and the source clock bar signal CLKB, the first internal clock RCLK and the reference clock REFCLK are output in synchronization with the source clock signal CLK, and the second internal clock FCLK is output in synchronization with the source clock bar signal CLKB. Since the source clock signal CLK is opposite in phase to the source clock bar signal CLKB, the first internal clock RCLK and the reference clock REFCLK are opposite in phase to the second internal clock FCLK.

Therefore, on the basis of the source clock signal CLK, the first internal clock RCLK and the reference clock REFCLK are synchronized with a rising edge of the source clock signal CLK, and the second source clock FCLK is synchronized with a falling edge of the source clock signal CLK.

In the register controlled DLL circuit of the invention, the divider 480 for dividing the frequency of the reference clock REFCLK at a predetermined ratio is employed to reduce power consumption.

That is, the reference clock REFCLK is used to control the operation of the inventive register controlled DLL circuit through phase comparison with the feedback clock FEEDBACK_CLK. If the source clock signal CLK and the source clock bar signal CLKB input from the outside have high frequencies, the reference clock REFCLK and the feedback clock FEEDBACK_CLK also have high frequencies. When comparing phases of the reference clock REFCLK and the feedback clock FEEDBACK_CLK with each other, power consumption becomes larger as the frequencies of the reference clock REFCLK and the feedback clock FEEDBACK_CLK are higher. Accordingly, the register controlled DLL circuit of the invention employs a power-saving method of reducing power consumption by performing a phase comparison using the divided reference clock REFCLK_DIV if the external source clock signals CLK and CLKB of high frequencies are used.

For the aforesaid reason, the register controlled DLL circuit of the invention employs the divider 480 between the dummy clock buffer 406 and the phase comparator 420, and thus the phase comparison is performed using the divided reference clock REFCLK_DIV that is obtained by dividing the reference clock REFCLK at a predetermined ratio, instead of directly using the reference clock REFCLK synchronized with the clock edge of the source clock signal CLK. The predetermined ratio is 1/N (N is a natural number greater than 2), generally 4 or 8.

The phase comparator 420, which compares phases of the divided reference clock REFCLK_DIV and the feedback clock FEEDBACK_CLK with each other, changes a value of the comparison signal PHASE_COMP depending on a phase difference between the divided reference clock REFCLK_DIV and the feedback clock FEEDBACK_CLK, thereby controlling the operation of the register controlled DLL circuit in accordance with the embodiment of the invention.

For example, if the phase difference between the divided reference clock REFCLK_DIV and the feedback clock FEEDBACK_CLK deviates from a predetermined range so that the phase difference becomes relatively great, a first signal value of the comparison signal PHASE_COMP is changed, thus allowing a fast mode operation to be performed.

On the contrary, if the phase difference between the divided reference clock REFCLK_DIV and the feedback clock FEEDBACK_CLK deviates from the predetermined range so that the phase difference becomes relatively small, a second signal value of the comparison signal PHASE_COMP is changed, thus allowing a normal mode operation to be performed.

If the phase difference between the divided reference clock REFCLK_DIV and the feedback clock FEEDBACK_CLK does not deviate from the predetermined range, a third signal value of the comparison signal PHASE_COMP is changed, allowing a fine mode operation to be performed.

The clock delay circuit 440 performs following operations in response to the operation of the phase comparator 420. In the fast mode operation, the clock delay circuit 440 delays the phases of the first internal clock RCLK, the second internal clock FCLK and the divided reference clock REFCLK_DIV using a delay unit group according to the variation of the first signal value of the comparison signal PHASE_COMP. The delay unit group includes predetermined number of groups having first delay units, and also includes predetermined number of groups having second delay units.

In the normal mode operation, the clock delay circuit 440 delays the phases of the first internal clock RCLK, the second internal clock FCLK and the divided reference clock REFCLK_DIV through the first delay units or the second delay units according to the variation of the second signal value of the comparison signal PHASE_COMP.

In the fine mode operation, the clock delay circuit 440 delays the phases of the first internal clock RCLK, the second internal clock FCLK and the divided reference clock REFCLK_DIV in units of a divided delay duration according to the variation of the second signal value of the comparison signal PHASE_COMP. Herein, the divided delay duration is obtained by dividing a delay duration of a first delay unit or a second delay unit into predetermined number.

Figure 5:
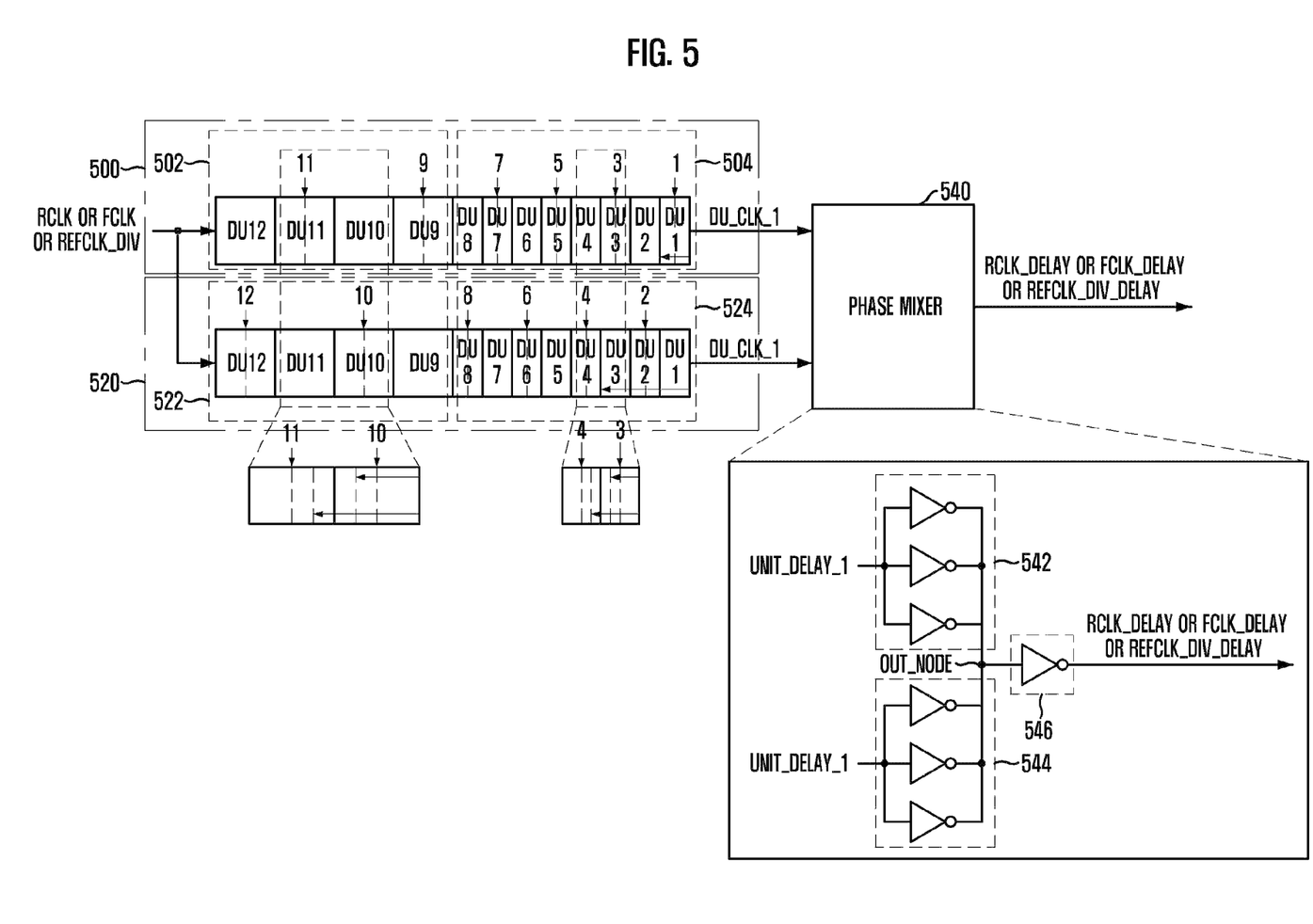
FIG. 5 is a block diagram illustrating a delay unit of a clock delay circuit in the register controlled DLL circuit of FIG. 4 in accordance with an embodiment of the invention.

FIG. 5 is a block diagram illustrating a delay unit of a clock delay circuit in the register controlled DLL circuit of FIG. 4 in accordance with an embodiment of the invention.

Referring to FIG. 5, each of the delay units 442, 444 and 446 of the clock delay circuit 440 may have two inventive configurations.

As a first inventive configuration, each of the delay units 442, 444 and 446 of the clock delay circuit 440 includes a first delay line 500, a second delay line 520, and a phase mixer 540. The first delay line 500 includes a plurality of first delay units DU1, DU2, DU3, DU4, DU5, DU6, DU7 and DU8 and a plurality of second delay units DU9, DU10, DU11 and DU12, which are connected in series, and delays the first internal clock RCLK, the second internal clock FCLK or the divided reference clock REFCLK_DIV through odd-numbered delay units that are selected in predetermined sequence in response to the delay control signal DELAY_CON. The second delay line 520 includes a plurality of first delay units DU1, DU2, DU3, DU4, DU5, DU6, DU7 and DU8 and a plurality of second delay units DU9, DU10, DU11 and DU12, which are connected in series, and delays the first internal clock RCLK, the second internal clock FCLK or the divided reference clock REFCLK_DIV through even-numbered delay units that are selected in predetermined sequence in response to the delay control signal DELAY_CON. The phase mixer 540 mixes a phase of a clock DU_CLK_1 output from the first delay 500 and a phase of the clock DU_CLK_2 output from the second delay line 520 at a mixing ratio varying according to the delay control signal DELAY_CON.

The phase mixer 540 includes a first inversion-driving unit 542, a second inversion-driving unit 544, and a third inversion-driving unit 546. The first inversion-driving unit 542 inverts and drives the output clock DU_CLK_1 of the first delay line 500 to apply the inverted clock to an output node OUT_NODE with an ability to drive that varies according to the delay control signal DELAY_CON. The second inversion-driving unit 544 inverts and drives the output clock DU_CLK_2 of the second delay line 520 to apply the inverted clock to the output node OUT_NODE with an ability to drive that varies according to the delay control signal DELAY_CON. The third inversion-driving unit 546 inverts and drives a clock of the output node OUT_NODE with a predetermined ability to drive.

As a second inventive configuration, each of the rising clock delay 442, the falling clock delay 444 and the dummy delay 446 includes a first delay unit 4422, 4442 or 4462 and a second delay unit 4424, 4444 or 4464. As for the first delay unit, each of the first delay units 4422, 4442 and 4462 includes a first delay line 504, a second delay line 524, and a phase mixer 540. The first delay line 504 includes a plurality of first delay units DU1, DU2, DU3, DU4, DU5, DU6, DU7 and DU8 connected in series, and delays the first internal clock RCLK, the second internal clock FCLK or the divided reference clock REFCLK_DIV through odd-numbered delay units that are selected in predetermined sequence in response to the delay control signal DELAY_CON during the normal mode operation. The second delay line 524 includes a plurality of first delay units DU1, DU2, DU3, DU4, DU5, DU6, DU7 and DU8 connected in series, and delays the first internal clock RCLK, the second internal clock FCLK or the divided reference clock REFCLK_DIV through even-numbered delay units that are selected in predetermined sequence in response to the delay control signal DELAY_CON during the normal mode operation. The phase mixer 540 mixes a phase of a clock DU_CLK_1 output from the first delay 504 and a phase of the clock DU_CLK_2 output from the second delay line 524 at a mixing ratio varying according to the delay control signal DELAY_CON during the fine mode operation.

As for the second delay unit, each of the second delay units 4424, 4444 and 4464 includes a first delay line 502, a second delay line 522, and a phase mixer 540. The first delay line 502 includes a plurality of second delay units DU9, DU10, DU11 and DU12 connected in series, and delays the first internal clock RCLK, the second internal clock FCLK or the divided reference clock REFCLK_DIV through odd-numbered delay units that are selected in predetermined sequence in response to the delay control signal DELAY_CON during the normal operation. The second delay line 520 includes a plurality of second delay units DU9, DU10, DU11 and DU12 connected in series, and delays the first internal clock RCLK, the second internal clock FCLK or the divided reference clock REFCLK_DIV through even-numbered delay units that are selected in predetermined sequence in response to the delay control signal DELAY_CON during the normal operation. The phase mixer 540 mixes a phase of the clock DU_CLK_1 output from the first delay 502 and a phase of the clock DU_CLK_2 output from the second delay line 522 at a mixing ratio varying according to the delay control signal DELAY_CON during the fine mode operation.

The phase mixer 540, which is shared by the first delay units 4422, 4442 and 4462 and the second delay units 4424, 4444 and 4464, includes a first inversion-driving unit 542, a second inversion-driving unit 544, and a third inversion-driving unit 546. The first inversion-driving unit 542 inverts and drives the output clock DU_CLK_1 of the first delay lines 502 and 504 to apply the inverted clock to an output node OUT_NODE with an ability to drive that varies according to the delay control signal DELAY_CON. The second inversion-driving unit 544 inverts and drives the output clock DU_CLK_2 of the second delay lines 522 and 524 to apply the inverted clock to the output node OUT_NODE with an ability to drive that varies according to the delay control signal DELAY_CON. The third inversion-driving unit 546 inverts and drives a clock of the output node OUT_NODE with a predetermined ability to drive.

Herebelow are operation of the delay units 442, 444 and 446 of the clock delay unit 440 in the register controlled DLL circuit in accordance with the embodiment of the invention. For reference, description will be made on the basis of the first inventive configuration.

First, the first delay line 500 selects the odd-numbered delay units DU1, DU3, DU5, DU7, DU9 and DU11 among the plurality of first delay units DU1, DU2, DU3, DU4, DU5, DU6, DU7 and DU8, and the plurality of second delay units DU9, DU10, DU11 and DU12 in response to the delay control signal DELAY_CON in predetermined sequence. That is, the first delay line 500 delays the first internal clock RCLK, the second internal clock FCLK or the divided reference clock REFCLK_DIV by the point "1", "3", "5", "7", "9", or "11".

The predetermined sequence may differ according to an operation mode of the clock delay circuit 440. In the fast mode, the first delay unit DU1 corresponding to the point "1" among the odd-numbered delay units DU1, DU3, DU5, DU7, DU9 and DU11 of the first delay line 500 is selected first, then the fifth delay unit DU5 corresponding to the point "5" is selected, and thereafter the ninth delay unit DU9 corresponding to the point "9" is selected. That is, the first delay line 500 delays the first internal clock RCLK, the second internal clock FCLK or the divided reference clock REFCLK_DIV by a delay duration of <½×first delay unit> corresponding to the point "1", by a delay duration of <(4+½)×first delay unit> corresponding to the point "5", or by a summed delay duration of <8×first delay unit> and <½×second delay unit> corresponding to the point "9".

In the normal mode, the first delay unit DU1 corresponding to the point "1" among the odd-numbered delay units DU1, DU3, DU5, DU7, DU9 and DU11 of the first delay line 500 is selected first; then the third delay unit DU3 corresponding to the point "3" is selected; then the fifth delay unit DU5 corresponding to the point "5" is selected; thereafter the seventh delay unit DU7 corresponding to the point "7" is selected; subsequently the ninth delay unit DU9 corresponding to the point "9" is selected; and finally the eleventh delay unit DU11 corresponding to the point "11" is selected. That is, the first delay line 500 delays the first internal clock RCLK, the second internal clock FCLK or the divided reference clock REFCLK_DIV by a delay duration of <½×first delay unit> corresponding to the point "1", by a delay duration of <(2+½)×first delay unit> corresponding to the point "3", by a delay duration of <(4+½)×first delay unit> corresponding to the point "5", by a delay duration of <(6+½)×first delay unit> corresponding to the point "7", by a summed delay duration of <8×first delay unit> and <½×second delay unit> corresponding to the point "9", or by a summed delay duration of <8×first delay unit> and <(2+½)×second delay duration> corresponding to the point "11".

In the fine mode, the delay units selected during the normal mode among the odd-numbered delay units DU1, DU3, DU5, DU7, DU9 and DU11 of the first delay line 500 are maintained as they are. In this mode, the first delay line 500 delays the first internal clock RCLK, the second internal clock FCLK or the divided reference clock REFCLK_DIV by a delay duration smaller than the delay duration of the first or second delay unit, which will be more fully described together with description for operation of the phase mixer 540 later.

The second delay line 520 selects the even-numbered delay units DU2, DU4, DU6, DU8, DU10 and DU12 among the plurality of first delay units DU1, DU2, DU3, DU4, DU5, DU6, DU7 and DU8, and the plurality of second delay units DU9, DU10, DU11 and DU12 in response to the delay control signal DELAY_CON in predetermined sequence. That is, the second delay line 520 delays the first internal clock RCLK, the second internal clock FCLK or the divided reference clock REFCLK_DIV by the point "2", "4", "6", "8", "10" or "12".

The predetermined sequence may differ according to an operation mode of the clock delay circuit 440. In the fast mode, the second delay unit DU2 corresponding to the point "2" among the even-numbered delay units DU2, DU4, DU6, DU8, DU10 and DU12 of the second delay line 520 is selected first, then the sixth delay unit DU6 corresponding to the point "6" is selected, and thereafter the tenth delay unit DU10 corresponding to the point "10" is selected. That is, the second delay line 520 delays the first internal clock RCLK, the second internal clock FCLK or the divided reference clock REFCLK_DIV by a delay duration of <(1+½)×first delay unit> corresponding to the point "2", by a delay duration of <(5+½)×first delay unit> corresponding to the point "6, or by a summed delay duration of <8×first delay unit> and <(1+½)×second delay duration> corresponding to the point "10".

In the normal mode, the second delay unit DU2 corresponding to the point "2" among the even-numbered delay units DU2, DU4, DU6, DU8, DU10 and DU12 of the second delay line 520 is selected first; then the fourth delay unit DU4 corresponding to the point "4" is selected; then the sixth delay unit DU6 corresponding to the point "6" is selected; thereafter the eighth delay unit DU8 corresponding to the point "8" is selected; subsequently the tenth delay unit DU10 corresponding to the point "10" is selected; and finally the twelfth delay unit DU12 corresponding to the point "12" is selected. That is, the second delay line 520 delays the first internal clock RCLK, the second internal clock FCLK or the divided reference clock REFCLK_DIV by a delay duration of <(1+½)×first delay unit> corresponding to the point "2", by a delay duration of <(3+½)×first delay unit> corresponding to the point "4", by a delay duration of <(5+½)×first delay unit> corresponding to the point "6", by a delay duration of <(7+½)×first delay unit> corresponding to the point "8", by a summed delay duration of <8×first delay unit> and <(1+½)×second delay duration> corresponding to the point "10", or by a summed delay duration of <8×first delay unit> and <(3+½)×second delay duration> corresponding to the point "12".

In the fine mode, the delay units selected during the normal mode among the even-numbered delay units DU2, DU4, DU6, DU8, DU10 and DU12 of the second delay line 520 are maintained as they are. The second delay line 520 delays the first internal clock RCLK, the second internal clock FCLK or the divided reference clock REFCLK_DIV by a delay duration smaller than the delay duration of the first or second delay unit, which will also be more fully described together with description for operation of the phase mixer 540 later.

The phase mixer 540 mixes the output clock DU_CLK_1 of the first delay line 500 and the output clock DU_CLK_2 of the second delay line 520 at a mixing ratio corresponding to the delay control signal DELAY_CON.

The mixing ratio corresponding to the delay control signal DELAY_COM varies according to operation of the clock delay unit 440. In the fast mode and the normal mode, the phase mixer 540 mixes the phase of the output clock DU_CLK_1 of the first delay line 500 and the phase of the output clock DU_CLK_2 of the second delay line 520 at a mixing ratio of 1:1.

For example, when the phase of the output clock DU_CLK_1 of the first delay line 500 is delayed by a delay duration of <(1+½)×first delay unit> corresponding to the point "3", and the phase of the output clock DU_CLK_2 of the second delay line 520 is delayed by a delay duration of <(3+½)×first delay unit> corresponding to the point "4", the first internal clock RCLK, the second internal clock FCLK or the divided reference clock REFCLK_DIV is delayed by a delay duration of <3×first delay unit> corresponding to the center between the points "3" and "4" so that a delayed first internal clock RCLK_DELAY, a delayed second internal clock FCLK_DELAY or a delayed divided reference clock REFCLK_DIV_DELAY, which has the delay duration of <3×first delay unit>, is output from the phase mixer 540.

Likewise, when the phase of the output clock DU_CLK_1 of the first delay line 500 is delayed by a summed delay duration of <8×first delay unit> and <(2+½)×second delay unit> corresponding to the point "11", and the phase of the output clock DU_CLK_2 of the second delay line 520 is delayed by a summed delay duration of <8×first delay unit> and <(1+½)×second delay unit> corresponding to the point "10", the first internal clock RCLK, the second internal clock FCLK or the divided reference clock REFCLK_DIV is delayed by a summed delay duration of <8×first delay unit> and <2×second delay unit> corresponding to the center between the points "10" and "11".

In the fine mode, the phase of the output clock DU_CLK_1 of the first delay line 500 and the phase of the output clock DU_CLK_2 of the second delay line 520 are mixed at a mixing ratio varying according to the delay control signal.

For example, even in the case where the phase of the output clock DU_CLK_1 of the first delay line 500 is delayed by a delay duration of <(1+½)×first delay unit> corresponding to the point "3", and the phase of the output clock DU_CLK_2 of the second delay line 520 is delayed by a delay duration of <(3+½)×first delay unit> corresponding to the point "4", the first internal clock RCLK, the second internal clock FCLK or the divided reference clock REFCLK_DIV can be delayed by a delay duration of <(2+¼)×first delay unit> corresponding to ¼ point between the points "3" and "4" so that a delayed first internal clock RCLK_DELAY, a delayed second internal clock FCLK_DELAY or a delayed divided reference clock REFCLK_DIV_DELAY, which has the delay duration of <(2+¼)×first delay unit>, is output from the phase mixer 540, if the mixing ratio is set such that the output clock DU_CLK_1 of the first delay line 500 is 75% and the output clock DU_CLK_2 of the second delay line 520 is 25%.

In this case, if the mixing ratio is set such that the output clock DU_CLK_1 of the first delay line 500 is 25% and the output clock DU_CLK_2 of the second delay line 520 is 75%, the first internal clock RCLK, the second internal clock FCLK or the divided reference clock REFCLK_DIV can be delayed by a delay duration of <(3+¼)×first delay unit> corresponding to ¾ point between the points "3" and "4" so that a delayed first internal clock RCLK_DELAY, a delayed second internal clock FCLK_DELAY or a delayed divided reference clock REFCLK_DIV_DELAY, which has the delay duration of <(3+¼)×first delay unit>, is output from the phase mixer 540.

As described above, the register controlled DLL circuit in accordance with the embodiment of the invention appropriately controls the delay control signal DELAY_CON according to an operation mode, making it possible to select a delay duration smaller than the delay duration of the first or second delay unit.

Figure 6:
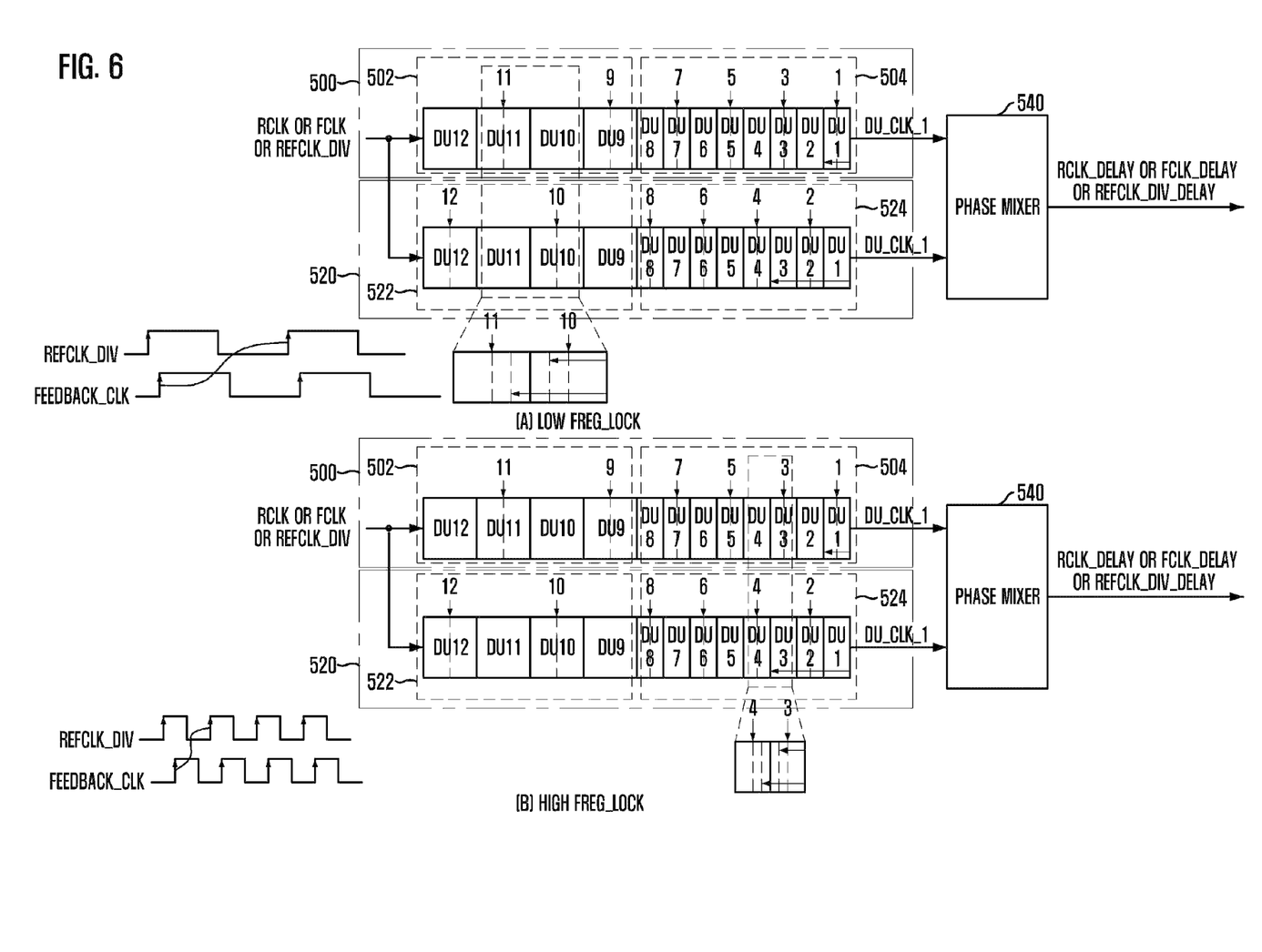
FIG. 6 illustrates operation of the delay unit of the clock delay circuit in the register controlled DLL circuit of FIG. 1 in accordance with an embodiment of the invention.

FIG. 6 illustrates operation of the delay unit of the clock delay circuit in the register controlled DLL circuit of FIG. 1 in accordance with an embodiment of the invention.

Referring to FIG. 6, the divided reference clock REFCLK_DIV and the feedback clock FEEDBACK_CLK, which have different frequencies from each other, are input to the delay units 442, 444 and 446 of the clock delay circuit 440 in the conventional register controlled DLL circuit of FIG. 4.

When the divided reference clock REFCLK_DIV and the feedback clock FEEDBACK_CLK have low frequencies (see LOW FREQ_LOCK in FIG. 6A), it can be appreciated that the divided reference clock REFCLK_DIV and the feedback clock FEEDBACK_CLK have relatively long periods. Hence, a delay duration between the feedback clock FEEDBACK_CLK and the divided reference clock REFCLK_DIV for performing a delay locking operation is relatively large.

Therefore, the delay units 442, 444 and 446 of the clock delay circuit 440 delay the first internal clock RCLK, the second internal clock FCLK or the divided reference clock REFCLK_DIV by a relatively large delay duration, and then output the delayed first internal clock RCLK_DELAY, the delayed second internal clock FCLK_DELAY or the delayed divided reference clock REFCLK_DIV_DELAY.

Specifically, since the delay duration between the divided reference clock REFCLK_DIV and the feedback clock FEEDBACK_CLK is larger than the delay duration of the plurality of first delay units DU1, DU2, DU3, DU4, DU5, DU6, DU7 and DU8 connected in series, one of the points belonging to the plurality of second delay units DU9, DU10, DU11 and DU12 connected in series is selected.

Hence, in the first delay line 500 of each of the delay units 442, 444 and 446 in the clock delay circuit 440, the delay duration between the divided reference clock REFCLK_DIV and the feedback clock FEEDBACK_CLK is smaller than the delay duration corresponding to the point "11" and greater than the delay duration corresponding to the point "9", but closer to the delay duration corresponding to the point "11". Consequently, the point "9" is selected in the fast mode, and the point "11" is selected in the normal mode.

In the second delay line 520 of each of the delay units 442, 444 and 446 in the clock delay circuit 440, the delay duration between the divided reference clock REFCLK_DIV and the feedback clock FEEDBACK_CLK is smaller than the delay duration corresponding to the point "12" and greater than the delay duration corresponding to the point "10", but closer to the delay duration corresponding to the point "10". Consequently, the point "10" is selected in the fast mode, and the point "10" is also selected in the normal mode.

In the fine mode, the phase mixer 540 of each of the delay units 442, 444 and 446 delays the first internal clock RCLK, the second internal clock FCLK or the divided reference clock REFCLK_DIV in units of a divided delay duration, e.g., a delay duration of <¼×delay unit> in FIG. 6, according to the delay control signal DELAY_CON. Herein, the divided delay duration is obtained by dividing a difference between the delay duration corresponding to the point "11" selected by the first delay line 500 during the normal mode and the delay duration corresponding to the point "10" selected by the second delay line 520 during the normal mode, into predetermined number, e.g., 4.

A delay duration between the feedback clock FEEDBACK_CLK and the divided reference clock REFCLK_DIV, allowing the delay locking operation to be performed in the fine mode operation of the phase mixer 540, may vary in units of a delay duration of <¼×second delay unit> between the summed delay duration of <8×first delay unit> and <(2+½)×second delay unit> corresponding to the point "11", and the summed delay duration of <8×delay unit> and <(1+½)×second delay unit> corresponding to the point "10".

Although the delay duration of the second delay unit is relatively larger than the delay duration of the first delay unit, the variable delay duration (i.e., the delay duration of <¼× second delay unit>) due to the fine mode operation of the phase mixer 540 is relatively small, considering that the delay duration between the divided reference clock REFCLK_DIV and the feedback clock FEEDBACK_CLK has the maximum (i.e., the summed delay duration of <8×first delay unit> and <(1+½)×second delay unit>) and the minimum (i.e., the summed delay duration of <8×first delay unit> and <(2+½)× second delay unit>).

Therefore, when the divided reference clock REFCLK_DIV and the feedback clock FEEDBACK_CLK have relatively low frequencies, it is possible to finely adjust the delay duration between the divided reference clock REFCLK_DIV and the feedback clock FEEDBACK_CLK to perform the delay locking operation through the fine mode operation of the phase mixer 540.

In contrast, when the divided reference clock REFCLK_DIV and the feedback clock FEEDBACK_CLK have high frequencies (see HIGH FREG_LOCK in FIG. 6B), it can be appreciated that the divided reference clock REFCLK_DIV and the feedback clock FEEDBACK_CLK have relatively short periods. Hence, a delay duration between the feedback clock FEEDBACK_CLK and the divided reference clock REFCLK_DIV for performing delay locking operation is relatively small.

Therefore, the delay units 442, 444 and 446 of the clock delay circuit 440 delay the first internal clock RCLK, the second internal clock FCLK or the divided reference clock REFCLK_DIV by a relatively small delay duration, and then output the delayed first internal clock RCLK_DELAY, the delayed second internal clock FCLK_DELAY or the delayed divided reference clock REFCLK_DIV_DELAY.

Specifically, since the delay duration between the divided reference clock REFCLK_DIV and the feedback clock FEEDBACK_CLK is smaller than the delay duration of the plurality of first delay units DU1, DU2, DU3, DU4, DU5, DU6, DU7 and DU8 connected in series, one of the points belonging to the plurality of first delay units DU1, DU2, DU3, DU4, DU5, DU6, DU7 and DU8 connected in series.

Hence, in the first delay line 500 of each of the delay units 442, 444 and 446 in the clock delay circuit 440, the delay duration between the divided reference clock REFCLK_DIV and the feedback clock FEEDBACK_CLK is smaller than the delay duration corresponding to the point "5" and greater than the delay duration corresponding to the point "3", but closer to the delay duration corresponding to the point "3". Consequently, the point "5" is selected in the fast mode, and the point "3" is selected in the normal mode.

In the second delay line 520 of each of the delay units 442, 444 and 446 in the clock delay circuit 440, the delay duration between the divided reference clock REFCLK_DIV and the feedback clock FEEDBACK_CLK is smaller than the delay duration corresponding to the point "4" and greater than the delay duration corresponding to the point "2", but closer to the delay duration corresponding to the point "4". Consequently, the point "2" is selected in the fast mode, and the point "4" is selected in the normal mode.

In the fine mode, the phase mixer 540 of each of the delay units 442, 444 and 446 delays the first internal clock RCLK, the second internal clock FCLK or the divided reference clock REFCLK_DIV in units of a divided delay duration, e.g., a delay duration of <¼×delay unit> in FIG. 6, according to the delay control signal DELAY_CON. Herein, the divided delay duration is obtained by dividing a difference between the delay duration corresponding to the point "3" selected by the first delay line 500 in the normal mode and the delay duration corresponding to the point "4" selected by the second delay line 520 in the normal mode, into a predetermined number, e.g., 4.

A delay duration between the feedback clock FEEDBACK_CLK and the divided reference clock REFCLK_DIV, allowing the delay locking operation to be performed in the fine mode operation of the phase mixer 540, may vary in units of a delay duration of <¼×first delay unit> between the delay duration of <(2+½)×first delay unit> corresponding to the point "3" and the delay duration of <(3+½)×delay unit> corresponding to the point "4".

Here, considering that the delay duration between the divided reference clock REFCLK_DIV and the feedback clock FEEDBACK_CLK has the maximum (i.e., the delay duration of <(3+½)×first delay unit> and the minimum (i.e., the delay duration of <2+½>×first delay unit>, the variable delay duration due to the fine mode operation of the phase mixer 540 is relatively large.

Therefore, even when the divided reference clock REFCLK_DIV and the feedback clock FEEDBACK_CLK have relatively high frequencies, it is possible to finely adjust the delay duration between the divided reference clock REFCLK_DIV and the feedback clock FEEDBACK_CLK to perform the delay locking operation through the fine mode operation of the phase mixer 540.

As described above, the register controlled DLL circuit in accordance with the invention includes a delay line having delay units with different delay durations, and thus delay units of the delay line can be differently selected according to an operation frequency of a semiconductor device. That is, it is possible to change a variation width of an adjustable delay duration according to an operation frequency of a semiconductor device.

Consequently, it is possible to prevent a jitter with high value from being generated in a clock that is output through a delay locking operation even though an operation frequency of a semiconductor device is high.

While the invention has been described with respect to the specific embodiments, it will be apparent to those skilled in the art that various changes and modifications may be made without departing from the spirit and scope of the invention as defined in the following claims.

For example, the number of the delay units included in the delay line in the aforesaid embodiment of the invention may be different from that illustrated in the drawings. That is, the cases where the number of the delay units of the delay line is greater or smaller than the number of delay units illustrated in the drawings also fall within a scope of the invention.

What is claimed is:

1. A register controlled delay locked loop (DLL) circuit, comprising:
    a phase comparator configured to compare phases of a source clock and a feedback clock with each other;
    a clock delay circuit configured to delay a phase of an internal clock synchronized with a clock edge of the source clock in response to an output signal of the phase comparator, wherein the clock delay circuit delays the phase of the internal clock using first delay units for a predetermined delay duration, and thereafter delays the phase of the internal clock using second delay units, each second delay unit providing a delay of longer duration than each first delay unit; and
    a delay replica model configured to reflect actual delay conditions of the source clock in an output clock of the clock delay circuit to output the feedback clock, wherein the clock delay circuit is configured to perform a normal mode operation of delaying the phase of the internal clock using the first delay units or the second delay units when a phase difference between the source clock and the feedback clock is greater than a predetermined range.

2. The register controlled DLL circuit as recited in claim 1, wherein the clock delay circuit is configured to perform a fine mode operation of delaying the phase of the internal clock in units of delay duration obtained by dividing the delay duration of the first or second delay unit by a predetermined number.

3. The register controlled DLL circuit as recited in claim 2, wherein the clock delay circuit is configured to perform the fine mode operation of delaying the phase of the internal clock in units that each provide a delay of a duration obtained by dividing the delay duration of the first delay unit by the predetermined number, when a phase difference between the source clock and the feedback clock becomes smaller than the predetermined range, by delaying the phase of the internal clock using the first delay unit so that the normal mode operation is terminated.

4. The register controlled DLL circuit as recited in claim 2, wherein the clock delay circuit is configured to perform the fine mode operation of delaying the phase of the internal clock in units that each provide a delay of a duration obtained by dividing the delay duration of the second delay unit by the predetermined number, when a phase difference between the source clock and the feedback clock becomes smaller than the predetermined range, by delaying the phase of the internal clock using the second delay units after delaying the phase of the internal clock using the first delay units so that the normal mode operation is terminated.

5. The register controlled DLL circuit as recited in claim 2, wherein the clock delay circuit includes
a first delay line including the first delay units and the second delay units, which are connected in series, and configured to delay the internal clock through odd-numbered delay units that are selected in a predetermined sequence in response to the output signal of the phase comparator during the normal mode operation;
a second delay line including the first delay units and the second delay units, which are connected in series, and configured to delay the internal clock through even-numbered delay units that are selected in a predetermined sequence in response to the output signal of the phase comparator during the normal mode operation; and
a phase mixer configured to mix a phase of a clock output from the first delay line and a phase of a clock output from the second delay line at a mixing ratio corresponding to the output signal of the phase comparator during the fine mode operation.

6. The register controlled DLL circuit as recited in claim 5, wherein the phase mixer includes
a first inversion-driving unit configured to invert and drive the clock output from the first delay line to apply an inverted clock to an output node, and having an ability to drive the first delay line clock output that varies according to the output signal of the phase comparator;
a second inversion-driving unit configured to invert and drive the clock output from the second delay line to apply an inverted clock to the output node, and having an ability to drive the second delay line clock output that varies according to the output signal of the phase comparator; and a third inversion-driving unit configured to invert and drive a clock of the output node with a predetermined driving ability.

7. A register controlled DLL circuit, comprising:
a phase comparator configured to compare phases of a source clock and a feedback clock with each other;
a first clock delay configured to delay a phase of an internal clock synchronized with a clock edge of the source clock using first delay units in response to an output signal of the phase comparator during a predetermined first operation;
a second clock delay configured to delay the phase of the internal clock synchronized with a clock edge of the source clock using second delay units in response to the output signal of the phase comparator during a predetermined second operation subsequent to the predetermined first operation, the second delay unit providing a delay of longer duration than the first delay; and
a delay replica model configured to reflect actual delay conditions of the source clock in an output clock of the first clock delay or an output clock of the second clock delay to output the feedback clock,
wherein, during the predetermined first operation, the first clock delay is configured to perform a normal mode operation of delaying the phase of the internal clock using the first delay unit when a phase difference between the source clock and the feedback clock is greater than a predetermined range.

8. The register controlled DLL circuit as recited in claim 7, wherein the first clock delay is configured to perform a fine mode operation of delaying the phase of the internal clock in units of delay duration obtained by dividing the duration of the delay provided by the first delay unit by a predetermined number.

9. The register controlled DLL circuit as recited in claim 7, wherein, during the predetermined second operation, the second clock delay is configured to perform a normal mode operation of delaying the phase of the internal clock using the second delay unit when a phase difference between the source clock and the feedback clock is greater than a predetermined range, and the first clock delay is configured to perform a fine mode operation of delaying the phase of the internal clock in units of delay duration obtained by dividing the duration of the delay provided by the second delay unit by a predetermined number.

10. The register controlled DLL circuit as recited in claim 7, wherein the first clock delay comprises:
a first delay line including the first delay units connected in series, and configured to delay the internal clock through odd-numbered delay units that are selected in a predetermined sequence in response to the output signal of the phase comparator during the normal mode operation;
a second delay line including the first delay units connected in series, and configured to delay the internal clock through even-numbered delay units that are selected in a predetermined sequence in response to the output signal of the phase comparator during the normal mode operation; and
a phase mixer configured to mix a phase of a clock output from the first delay line and a phase of a clock output from the second delay line at a mixing ratio corresponding to an output signal of the phase comparator during the fine mode operation.

11. The register controlled DLL circuit as recited in claim 10, wherein the phase mixer comprises:
a first inversion-driving unit configured to invert and drive the clock output from the first delay line to apply an inverted clock to an output node and having an ability to drive the first delay line clock output that varies according to the output signal of the phase comparator;

a second inversion-driving unit configured to invert and drive the clock output from the second delay line to apply an inverted clock to the output node and having an ability to drive the second delay line clock output that varies according to the output signal of the phase comparator; and a third inversion-driving unit configured to invert and drive a clock of the output node with a predetermined driving ability.

12. The register controlled DLL circuit as recited in claim 7, wherein the second clock delay comprises:

a first delay line including the second delay units connected in series, and configured to delay the internal clock through odd-numbered delay units that are selected in a predetermined sequence in response to the output signal of the phase comparator during the normal mode operation;

a second delay line including the second delay units connected in series, and configured to delay the internal clock through even-numbered delay units that are selected in a predetermined sequence in response to the output signal of the phase comparator during the normal mode operation; and a phase mixer configured to mix a phase of a clock output from the first delay line and a phase of a clock output from the second delay line at a mixing ratio corresponding to an output signal of the phase comparator during the fine mode operation.

13. A register controlled DLL circuit, comprising:

a phase comparator configured to compare phases of a source clock and a feedback clock with each other;

a clock delay circuit configured to delay a phase of an internal clock synchronized with a clock edge of the source clock in response to an output signal of the phase comparator, wherein the clock delay circuit delays the phase of the internal clock using delay units having different delay durations during a plurality of operations performed in a predetermined sequence; and a delay replica model configured to reflect actual delay conditions of the source clock in an output clock of the clock delay circuit to output the feedback clock, wherein, during respective operations, the clock delay circuit is configured to perform a normal mode operation of delaying the phase of the internal clock using the respective delay units when a phase difference between the source clock and the feedback clock is greater than a predetermined range.

14. The register controlled DLL circuit as recited in claim 13, wherein the clock delay circuit is configured to delay the phase of the internal clock using first delay units having a first delay duration in response to the output signal of the phase comparator during one of the plurality of operations and using second delay units having a second delay duration during another of the plurality of operations performed after said one of the plurality of operations, said first delay duration being smaller than said second delay duration.

15. The register controlled DLL circuit as recited in claim 13, wherein the clock delay circuit is configured to perform a fine mode operation of delaying the phase of the internal clock in units providing delays of a duration obtained by dividing a delay duration provided by each of the delay units by a predetermined number.

16. The register controlled DLL circuit as recited in claim 15, wherein the clock delay circuit comprises:

a first delay line including respective delay units connected in series, and configured to delay the internal clock through odd-numbered delay units that are selected in a predetermined sequence in response to the output signal of the phase comparator during the normal mode operation;

a second delay line including respective delay units connected in series, and configured to delay the internal clock through even-numbered delay units that are selected in a predetermined sequence in response to the output signal of the phase comparator during the normal mode operation; and a phase mixer configured to mix a phase of a clock output from the first delay line and a phase of a clock output from the second delay line at a mixing ratio corresponding to an output signal of the phase comparator during the fine mode operation.

17. The register controlled DLL circuit as recited in claim 16, wherein the phase mixer comprises:

a first inversion-driving unit configured to invert and drive the clock output from the first delay line to apply an inverted clock to an output node and having an ability to drive the first delay line clock output that varies according to the output signal of the phase comparator;

a second inversion-driving unit configured to invert and drive the clock output from the second delay line to apply an inverted clock to the output node and having an ability to drive the second delay line clock output that varies according to the output signal of the phase comparator; and a third inversion-driving unit configured to invert and drive a clock of the output node with a predetermined driving ability.

* * * * *